(12) United States Patent
Daigo et al.

(10) Patent No.: US 9,252,322 B2
(45) Date of Patent: Feb. 2, 2016

(54) EPITAXIAL FILM FORMING METHOD, VACUUM PROCESSING APPARATUS, SEMICONDUCTOR LIGHT EMITTING ELEMENT MANUFACTURING METHOD, SEMICONDUCTOR LIGHT EMITTING ELEMENT, AND ILLUMINATING DEVICE

(71) Applicant: CANON ANELVA CORPORATION, Kanagawa (JP)

(72) Inventors: Yoshiaki Daigo, Kanagawa (JP); Keiji Ishibashi, Kanagawa (JP)

(73) Assignee: Canon Anelva Corporation, Kawasaki-shi (JP)

( * ) Notice: Subject to any disclaimer, the term of this patent is extended or adjusted under 35 U.S.C. 154(b) by 268 days.

(21) Appl. No.: 13/661,948

(22) Filed: Oct. 26, 2012

(65) Prior Publication Data
US 2013/0049064 A1 Feb. 28, 2013

Related U.S. Application Data

(63) Continuation of application No. PCT/JP2011/059070, filed on Apr. 12, 2011.

(30) Foreign Application Priority Data

Apr. 30, 2010 (JP) .................................. 2010-105101

(51) Int. Cl.
*H01L 21/20* (2006.01)
*H01L 33/00* (2010.01)
(Continued)

(52) U.S. Cl.
CPC .......... *H01L 33/007* (2013.01); *C23C 16/4586* (2013.01); *C30B 23/02* (2013.01);
(Continued)

(58) Field of Classification Search
USPC ............... 257/103, E21.09, E33.023; 438/46, 438/478; 204/298.15, 298.08, 204/298.01–298.29
See application file for complete search history.

(56) References Cited

U.S. PATENT DOCUMENTS 5,267,607 A * 12/1993 Wada .......................... 165/80.1
2007/0215983 A1* 9/2007 Kim et al. ..................... 257/613
(Continued)

FOREIGN PATENT DOCUMENTS

JP 04-350930 A 12/1992
JP 07-302793 A 11/1995
(Continued)

OTHER PUBLICATIONS

Machine translation, Daigo, WIPO Pat. Pub. No. WO 2009/096270, translation date: Jun. 23, 2014, WIPO, all pages.*
(Continued)

*Primary Examiner* — Victoria K Hall
(74) *Attorney, Agent, or Firm* — Fitzpatrick, Cella, Harper & Scinto (57) ABSTRACT

The present invention provides: an epitaxial film forming method capable of fabricating a +c-polarity epitaxial film made of a Group III nitride semiconductor by sputtering; and a vacuum processing apparatus suitable for this epitaxial film forming method. In one embodiment of the present invention, a Group III nitride semiconductor thin film is epitaxially grown by sputtering on an $\alpha\text{-}Al_2O_3$ substrate heated to a desired temperature by using a heater. First, the $\alpha\text{-}Al_2O_3$ substrate is disposed on a substrate holder including the heater in such a way that the $\alpha\text{-}Al_2O_3$ substrate is disposed away from the heater by a predetermined distance. Then, an epitaxial film of a Group III nitride semiconductor thin film is formed on the $\alpha\text{-}Al_2O_3$ substrate in the state where the $\alpha\text{-}Al_2O_3$ substrate is disposed away from the heater by the predetermined distance.

9 Claims, 7 Drawing Sheets

(51) Int. Cl.
*C23C 16/458* (2006.01)
*C30B 23/02* (2006.01)
*C30B 29/40* (2006.01)
*H01L 21/02* (2006.01)
*H01L 33/18* (2010.01)

(52) U.S. Cl.
CPC ......... *C30B 29/403* (2013.01); *H01L 21/0242* (2013.01); *H01L 21/0254* (2013.01); *H01L 21/02458* (2013.01); *H01L 21/02631* (2013.01); *H01L 33/18* (2013.01)

(56) References Cited

U.S. PATENT DOCUMENTS

| | | | |
|---|---|---|---|
| 2009/0286342 A1* | 11/2009 | Takahashi et al. | 438/32 |
| 2010/0006430 A1* | 1/2010 | Miki et al. | 204/298.13 |
| 2010/0055318 A1* | 3/2010 | Volf et al. | 427/255.28 |
| 2010/0213476 A1 | 8/2010 | Yokoyama et al. | |
| 2012/0112320 A1* | 5/2012 | Kubo | C23C 16/303 257/615 |
| 2013/0277206 A1* | 10/2013 | Daigo et al. | 204/192.25 |
| 2014/0225154 A1* | 8/2014 | Daigo | 257/103 |
| 2015/0102371 A1* | 4/2015 | Daigo | H01L 33/32 257/94 |

FOREIGN PATENT DOCUMENTS

| | | | | |
|---|---|---|---|---|
| JP | H9-202969 | * | 8/1997 | ............ C23C 14/50 |
| JP | 2001-220672 A | | 8/2001 | |
| JP | 2008-109084 A | | 5/2008 | |
| JP | 2009-124100 A | | 6/2009 | |
| WO | 2008/047900 A1 | | 4/2008 | |
| WO | 2009/096270 A1 | | 8/2009 | |
| WO | WO 2009/096270 | * | 8/2009 | ............ C30B 29/38 |

OTHER PUBLICATIONS

Machine translation, Yokoyama, Japanese Pat. Pub. No. 2008-1091084, translation date: Nov. 28, 2014, JPO & Japio, all pages.*

Machine translation, Hara, Japanese Pat. Pub. No. H9-202969, translation date: Sep. 19, 2015, Espacenet, all pages.*

International Search Report in PCT/JP2011/059070, issued Jun. 7, 2011 (4 pages).

International Preliminary Report on Patentability in PCT/JP2011/059070, issued Dec. 10, 2012 (6 pages).

Daigo and Mutsukura (2005) "Synthesis of epitaxial GaN single-crystalline film by ultra high vacuum r.f. magnetron sputtering method" Thin Solid Films 483:38-43.

* cited by examiner

EPITAXIAL FILM FORMING METHOD, VACUUM PROCESSING APPARATUS, SEMICONDUCTOR LIGHT EMITTING ELEMENT MANUFACTURING METHOD, SEMICONDUCTOR LIGHT EMITTING ELEMENT, AND ILLUMINATING DEVICE

CROSS-REFERENCES TO RELATED APPLICATIONS

This application is a continuation application of International Application No. PCT/JP2011/059070, filed Apr. 12, 2011, which claims the benefit of Japanese Patent Application No. 2010-105101, filed Apr. 30, 2010. The contents of the aforementioned applications are incorporated herein by reference in their entireties.

TECHNICAL FIELD

The present invention relates to an epitaxial film forming method, a vacuum processing apparatus, a semiconductor light emitting element manufacturing method, a semiconductor light emitting element, and an illuminating device, and particularly relates to an epitaxial film forming method and a vacuum processing apparatus capable of forming a high-quality epitaxial film, as well as a semiconductor light emitting element manufacturing method, a semiconductor light emitting device, and an illuminating device using such an epitaxial film.

BACKGROUND ART

Group III nitride semiconductors are compound semiconductor materials obtained as compounds of any of aluminum (Al) atoms, gallium (Ga) atoms, and indium (In) atoms, which are Group IIIB elements (hereinafter, simply III elements), and nitrogen (N) atoms, which are a Group VB element (hereinafter, simply Group V element), i.e., aluminum nitride (AlN), gallium nitride (GaN), and indium nitride (InN), as well as mixed crystals thereof (AlGaN, InGaN, InAlN, and InGaAlN). Such Group III nitride semiconductors are materials expected to be applied to optical elements such as light emitting diodes (LEDs), laser diodes (LDs), photovoltaic solar cells (PVSCs), and photo diodes (PDs) that cover a wide wavelength range from a far ultraviolet range to a visible range to a near infrared range, as well as to electronic elements such as high electron mobility transistors (HEMTs) and metal-oxide-semiconductor field effect transistors (MOSFETs) for high-frequency, high-output use.

In general, in order to implement applications as described above, it is necessary to epitaxially grow a Group III nitride semiconductor thin film on a single-crystal substrate to obtain a high-quality single-crystal film (epitaxial film) with few crystal defects. To obtain such an epitaxial film, it is most desirable to perform homo-epitaxial growth by using a substrate made of the same material as the epitaxial film.

However, a single-crystal substrate made of a Group III nitride semiconductor is extremely expensive and has not therefore been utilized, except in some applications. Instead, a single-crystal film is obtained by hetero-epitaxial growth on a substrate of a different kind of material which is mainly sapphire ($\alpha$-Al$_2$O$_3$) or silicon carbide (SiC). In particular, $\alpha$-Al$_2$O$_3$ substrates are inexpensive, and those with a large area and a high quality are available. Thus, $\alpha$-Al$_2$O$_3$ substrates are utilized in almost all the LEDs using Group III nitride semiconductor thin films that are found in the market.

Meanwhile, the epitaxial growth of a Group III nitride semiconductor thin film as described above uses metalorganic chemical vapor deposition (MOCVD) which can provide an epitaxial film with a high quality and productivity. However, MOCVD has problems such as requiring a high production cost and having a tendency to develop particles, making it difficult to achieve a high yield.

In contrast, sputtering has characteristics of being capable of saving the production cost and having a low probability of developing particles. Accordingly, if at least part of the process for forming a Group III nitride semiconductor thin film can be replaced with sputtering, it may be possible to solve at least part of the above problems.

However, Group III nitride semiconductor thin films fabricated by sputtering have a problem that their crystal qualities tend to be poorer than those fabricated by MOCVD. For example, NPL 1 discloses the crystallinity of a Group III nitride semiconductor thin film fabricated by using sputtering. According to the description of NPL 1, a c-axis oriented GaN film is epitaxially grown on an $\alpha$-Al$_2$O$_3$ (0001) substrate by using radio-frequency magnetron sputtering, and the full width at half maximum (FWHM) of X-ray rocking curve (XRC) measurement on GaN (0002) plane is 35.1 arcmin (2106 arcsec). This value is a significantly large value as compared to GaN films on $\alpha$-Al$_2$O$_3$ substrates that are found in the current market, and indicates that tilt mosaic spread, which will be described later, is large and the crystalline quality is poor.

In other words, in order to employ sputtering as a process for forming a Group III nitride semiconductor thin film, it is necessary to reduce the mosaic spread of an epitaxial film made of a Group III nitride semiconductor so that a high crystalline quality can be achieved.

Meanwhile, there are tilt mosaic spread (offset of the crystalline orientation in a direction perpendicular to the substrate) and twist mosaic spread (offset of the crystalline orientation in an in-plane direction) as indexes to indicate the crystalline quality of an epitaxial film made of a Group III nitride semiconductor. FIGS. 10A to 10D are schematic views of crystals made of a Group III nitride semiconductor and epitaxially grown in the c-axis direction on an $\alpha$-Al$_2$O$_3$ (0001) substrate. In FIGS. 10A to 10D, reference numeral 901 is the $\alpha$-Al$_2$O$_3$ (0001) substrate; 902 to 911, the crystals made of the Group III nitride semiconductor; $c_f$, the orientation of the c axis of each crystal made of the Group III nitride semiconductor; $c_s$ the orientation of the c axis of the $\alpha$-Al$_2$O$_3$ (0001) substrate; $a_f$, the orientation of the a axis of each crystal made of the Group III nitride semiconductor; and $a_s$, the orientation of the a axis of the $\alpha$-Al$_2$O$_3$ (0001) substrate.

Figure 10A:
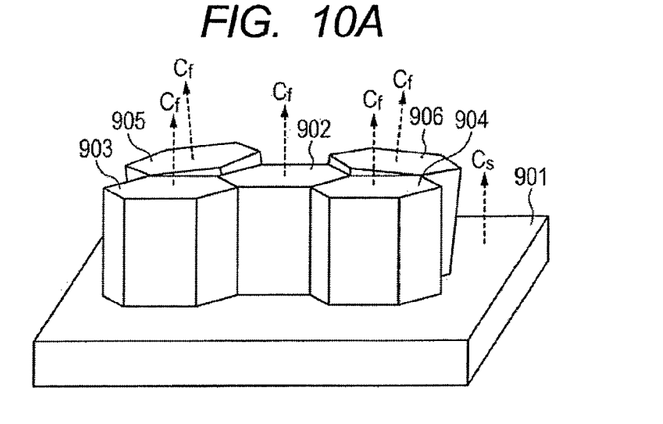
FIG. 10A is a schematic view showing tilt and twist mosaic spreads of crystals made of a Group III nitride semiconductor.
Figure 10B:
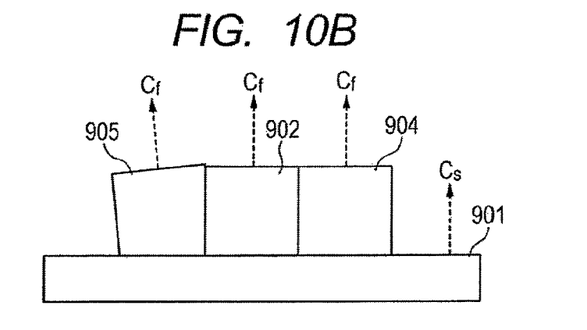
FIG. 10B is a schematic view showing the tilt and twist mosaic spreads of the crystals made of the Group III nitride semiconductor.
Figure 10C:
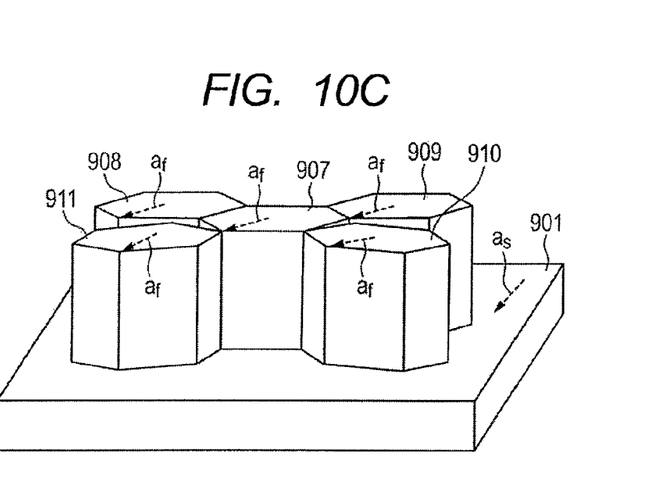
FIG. 10C is a schematic view showing tilt and twist mosaic spreads of crystals made of a Group III nitride semiconductor.
Figure 10D:
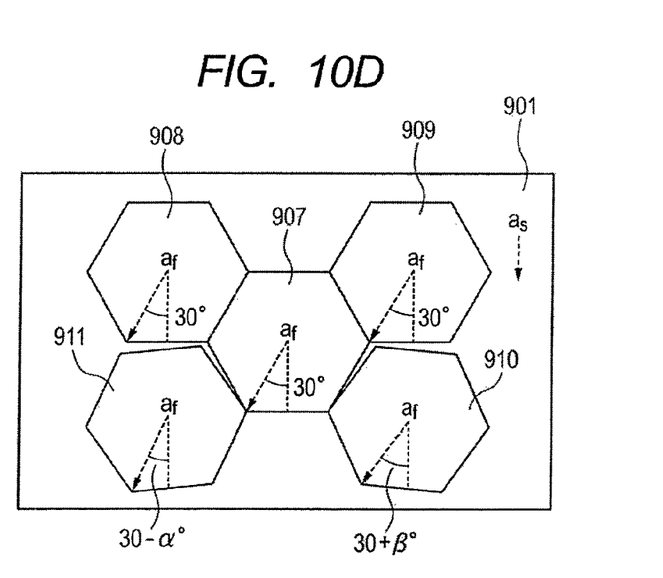
FIG. 10D is a schematic view showing the tilt and twist mosaic spreads of the crystals made of the Group III nitride semiconductor.

Here, FIG. 10A is a bird's eye view showing how the crystals made of the Group III nitride semiconductor are formed while having a tilt mosaic spread, and FIG. 10B shows the cross-sectional structures of part of the crystals. As can be seen from these drawings, the orientation $c_f$ of the c axis of each of crystals 902, 903, and 904 made of the Group III nitride semiconductor is substantially in parallel to the orientation $c_s$ of the c axis of the substrate, and is the most dominant crystalline orientation in the direction perpendicular to the substrate. On the other hand, each of crystals 905 and 906 made of the Group III nitride semiconductor is formed such that the orientation $c_f$ of its c axis is slightly off the dominant crystalline orientation in the direction perpendicular to the substrate. Moreover, FIG. 10C is a bird's eye view showing how the crystals made of the Group III nitride semiconductor are formed while having a twist mosaic spread, and FIG. 10D shows a plan view thereof. As can be seen from these drawings, the orientation $a_f$ of the a axis of each of crystals 907, 908, and 909 made of the Group III nitride semiconductor is the most dominant crystalline orientation in an in-plane direction because their angles with respect to the orientation $a_s$ of the a axis of the $\alpha$-Al$_2$O$_3$ (0001) substrate are all 30° approximately. On the other hand, each of crystals 910 and 911 made of the Group III nitride semiconductor is formed such that the orientation $o_f$ of its a axis is slightly off the dominant crystalline orientation in the in-plane direction.

Offset from the most dominant crystalline orientation as described above is called mosaic spread. Specifically, offset of a crystalline orientation in the direction perpendicular to the substrate is referred to as tilt mosaic spread, while offset of a crystalline orientation in an in-plane direction is referred to as twist mosaic spread. It is known that tilt and twist mosaic spreads are correlated to the density of defects formed inside a Group III nitride semiconductor thin film such as screw dislocations and edge dislocations. By reducing tilt and twist mosaic spreads, the density of defects described above is reduced, thus making it easier to obtain a high-quality Group III nitride semiconductor thin film.

Note that the levels of tilt and twist mosaic spreads can be evaluated by checking the FWHM of a diffraction peak obtained by XRC measurement on a specific lattice plane (symmetrical plane) formed in parallel to the substrate surface or on a specific lattice plane formed perpendicular to the substrate surface.

Note that FIGS. 10A to 10D and the above description are intended to describe tilt and twist mosaic spreads through a simple, conceptual approach, and not to guarantee any specificity. For example, it is not always the case that the above-described most dominant crystalline orientation in the direction perpendicular to the substrate and the above-described most dominant crystalline orientation in the in-plane direction coincide completely with the orientations of the c axis and the a axis of the $\alpha$-Al$_2$O$_3$ (0001) substrate. Further, it is not always the case that a gap between two crystals as shown in FIG. 10D is formed. What is important is that mosaic spread indicates the degree of offset from a dominant crystalline orientation.

Figure 11:
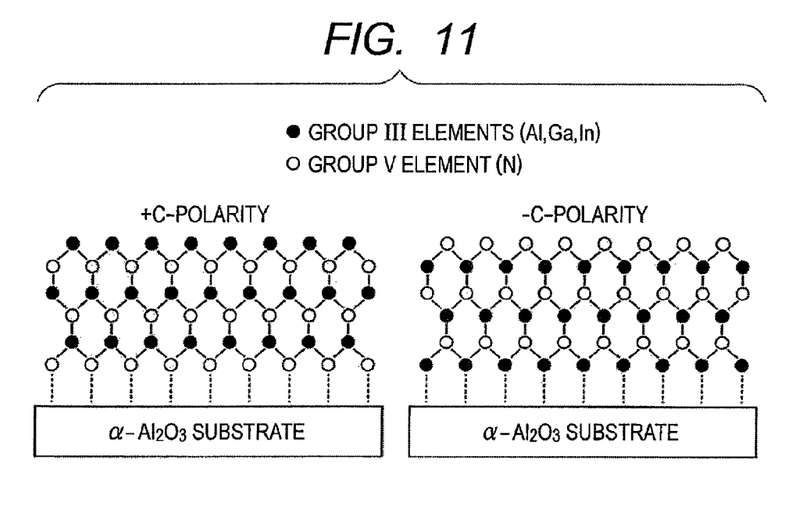
FIG. 11 is a schematic view showing +c polarity and −c polarity in a Group III nitride semiconductor thin film.

Meanwhile, in general, Group III nitride semiconductor thin films include a +c-polarity growth type and a −c-polarity growth type as shown in FIG. 11. It is known that a fine epitaxial film is more likely to be obtained by the +c-polarity growth than by the −c-polarity growth. Thus, it is desirable to obtain a +c-polarity epitaxial film in addition to employing sputtering as a process for forming a Group III nitride semiconductor thin film.

It is to be noted that in this description, "+c polarity" is a term meaning Al polarity, Ga polarity, and In polarity for AlN, GaN, and InN, respectively. Moreover, "−c polarity" is a term meaning N polarity.

Heretofore, a number of approaches have been made to obtain a fine Group III nitride semiconductor thin film (see PTLs 1 and 2).

PTL 1 discloses a method in which an $\alpha$-Al$_2$O$_3$ substrate is subjected to plasma processing before a Group III nitride semiconductor thin film (AlN in PTL 1) is formed on the substrate by using sputtering so that the Group III nitride semiconductor thin film can achieve a high quality, i.e., a Group III nitride semiconductor thin film with a significantly small tilt mosaic spread, in particular, can be obtained.

Moreover, PTL 2 discloses a method of manufacturing a Group III nitride semiconductor (a Group III nitride compound semiconductor in PTL 2) light emitting element, in which a buffer layer (an intermediate layer in PTL 2) made of a Group III nitride semiconductor (a Group III nitride compound in PTL 2) is formed on a substrate by sputtering, and then an n-type semiconductor layer including an underlying film, a light emitting layer, and a p-type semiconductor layer are sequentially stacked on the buffer layer made of the Group III nitride semiconductor.

In PTL 2, the procedure for forming the buffer layer made of the Group III nitride semiconductor is described as including: a pre-processing step of performing plasma processing on the substrate; and a step of forming the buffer layer made of the Group III nitride semiconductor by sputtering after the pre-processing step. Moreover, in PTL 2, an $\alpha$-Al$_2$O$_3$ substrate and AlN are used as preferred forms of the substrate and the buffer layer made of the Group III nitride semiconductor, respectively, and MOCVD is preferably used as the method of forming the n-type semiconductor layer including the underlying film, the light emitting layer, and the p-type semiconductor layer.

CITATION LIST

Patent Literature

PTL 1: International Patent Application Laid-Open No. WO2009/096270

PTL 2: Japanese Patent Application Laid-Open No. 2008-109084

Non Patent Literature

NPL 1: Y. Daigo, N. Mutsukura, "Synthesis of epitaxial GaN single-crystalline film by ultra high vacuum r.f. magnetron sputtering method", Thin Solid Films 483 (2005) p38-43.

SUMMARY OF INVENTION

Technical Problem

As is clear from the above, the technique described in PTL 1 is capable of reducing a tilt mosaic spread and seems to be a promising technique. However, the technique still has problems to be solved in order to form a higher-quality epitaxial film by using sputtering. Specifically, since the +c-polarity growth allows formation of a fine epitaxial film as mentioned earlier, it is desirable to form a +c-polarity Group III nitride semiconductor thin film on the entire substrate surface. However, PTL 1 mentions no specific means for obtaining that desired polarity. The present inventors conducted an experiment to confirm the technique disclosed in PTL 1. The result showed that the obtained Group III nitride semiconductor thin film was obtained as an epitaxial film with small mosaic spreads but +c polarity and −c polarity existed in a mixed state. It is therefore clear that the technique disclosed in PTL 1 cannot by itself provide a +c-polarity Group III nitride semiconductor thin film.

Moreover, the technique described in PTL 2 cannot be said to be satisfactory due to the following point. Specifically, PTL 2 includes no description about a method of controlling the polarity of the buffer layer made of the Group III nitride semiconductor and formed by using sputtering. The present inventors conducted an experiment to confirm the technique disclosed in PTL 2. The result showed that the obtained light emitting element was not able to have good light emission characteristics.

The present inventors further examined the light emitting element obtained in the above confirmation experiment of PTL 2, and found that the buffer layer made of the Group III nitride semiconductor and formed by using sputtering was an epitaxial film in which +c polarity and −c polarity existed in a mixed state. More specifically, even when the n-type semiconductor layer including the underlying film, the light emitting layer, and the p-type semiconductor layer were sequentially stacked by MOCVD, a large number of defects such as inversion domain boundaries attributable to the presence of mixed polarities in the buffer layer made of the Group III nitride semiconductor were formed inside the element and lowered the light emission characteristics. In other words, it is clear that the technique disclosed in PTL 2 cannot by itself provide a +c-polarity Group III nitride semiconductor thin film and thus cannot by itself provide a light emitting element with good light emission characteristics.

As described above, it is difficult for the conventional techniques disclosed in PTLs 1 and 2 to control by themselves the polarity of a Group III nitride semiconductor thin film, that is, to obtain by themselves a +c-polarity epitaxial film and therefore a more favorable light emitting element.

Further, from the results of the confirmation experiments of PTLs 1 and 2 described above, the present inventors concluded that when the Group III nitride semiconductor thin film fabricated by using sputtering is an epitaxial film in which mixed polarities exist, it is impossible to avoid deterioration of element characteristics due to defects such as inversion domain boundaries formed inside the element.

In view of the above problems, an object of the present invention is to provide an epitaxial film forming method capable of fabricating a +c-polarity epitaxial film by sputtering, and a vacuum processing apparatus suitable for this epitaxial film forming method, and further to provide a semiconductor light emitting element manufacturing method using this epitaxial film, as well as a semiconductor light emitting element manufactured by this manufacturing method, and an illuminating device.

The present inventors, through their extensive research, completed the present invention as a result of obtaining a new finding that the polarity of an epitaxial film is influenced by how a substrate is mounted on a substrate holder.

To achieve the above-described object, the present invention is an epitaxial film forming method of epitaxially growing a Group III nitride semiconductor thin film by sputtering on an $\alpha$-$Al_2O_3$ substrate heated to a desired temperature by using a heater, the method comprises the steps of: holding the $\alpha$-$Al_2O_3$ substrate away from a substrate facing surface of the heater by a predetermined distance; and forming an epitaxial film of a Group III nitride semiconductor thin film on the $\alpha$-$Al_2O_3$ substrate in the state of being held away from the substrate facing surface by the predetermined distance.

Moreover, the present invention is an epitaxial film forming method of forming an epitaxial film of a Group III nitride semiconductor thin film by sputtering on an $\alpha$-$Al_2O_3$ substrate by using a vacuum processing apparatus including: a vacuum chamber capable of vacuum pumping; substrate holding means for supporting the $\alpha$-$Al_2O_3$ substrate; and a heater capable of heating the $\alpha$-$Al_2O_3$ substrate held by the substrate holding means to a desired temperature, wherein an epitaxial film of a Group III nitride semiconductor thin film is formed on the $\alpha$-$Al_2O_3$ substrate in a state where the $\alpha$-$Al_2O_3$ substrate held by the substrate holding means is held away from a substrate facing surface of the heater by a predetermined distance.

Further, the present invention is a vacuum processing apparatus comprising: a vacuum chamber capable of vacuum pumping; substrate holding means for supporting a substrate; a heater capable of heating the substrate held by the substrate holding means to a desired temperature; and a target electrode which is provided inside the vacuum chamber and to which a target is attachable, wherein the substrate holding means is provided inside the vacuum chamber below the target electrode in a direction of gravity, and holds the substrate away from a substrate facing surface of the heater by a predetermined distance.

According to the present invention, a Group III nitride semiconductor epitaxial film having small tilt and twist mosaic spreads and also +c polarity can be fabricated on an $\alpha$-$Al_2O_3$ substrate by using sputtering. Moreover, the light emission characteristics of light emitting elements such as LEDs and LDs can be improved by using this Group III nitride semiconductor epitaxial film fabricated by sputtering.

DESCRIPTION OF EMBODIMENT

Hereinbelow, an embodiment of the present invention will be described in detail with reference to the drawings. Note that in the drawings to be described below, those having the same function are denoted by the same reference numeral, and overlapping description thereof is omitted.

(Embodiment)

A main feature according to the present invention is that when a Group III nitride semiconductor thin film is to be epitaxially grown on an α-Al$_2$O$_3$ substrate by such sputtering as radio frequency sputtering, the Group III nitride semiconductor film is formed in a state where the α-Al$_2$O$_3$ substrate heated by a heater is held away by a predetermined distance from the substrate facing surface of the heater. Hereinbelow, the present invention will be described with reference to the drawings. Note that members and arrangements described below are mere examples embodying the invention and do not limit the present invention. They can be modified in various ways on the basis of the gist of the present invention, as a matter of course.

Figure 1:
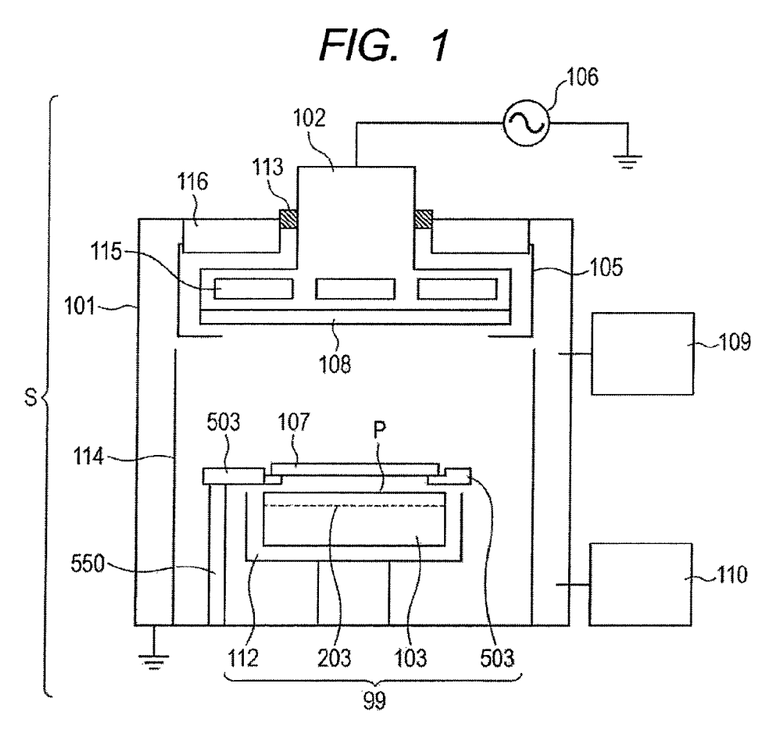
FIG. 1 is a schematic cross-sectional view of a radio-frequency sputtering apparatus according to one embodiment of the present invention.
Figure 2:
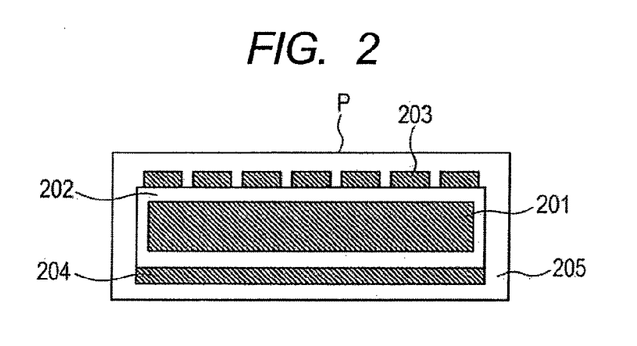
FIG. 2 is a schematic cross-sectional view of a heater according to one embodiment of the present invention.
Figure 3:
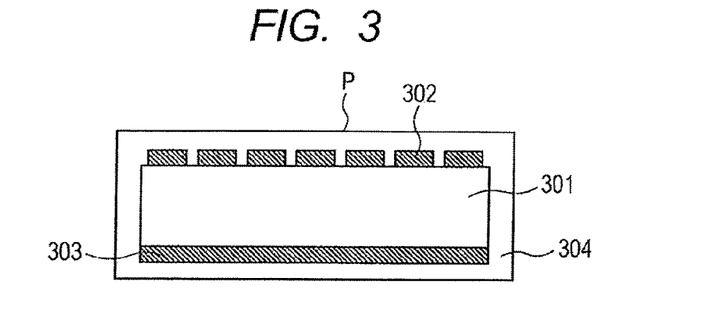
FIG. 3 is another schematic cross-sectional view of the heater according to one embodiment of the present invention.
Figure 4A:
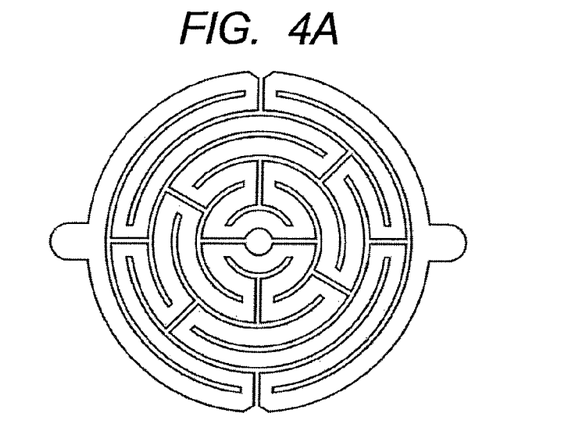
FIG. 4A is a plan view showing a configuration example of a heater electrode according to one embodiment of the present invention.
Figure 4B:
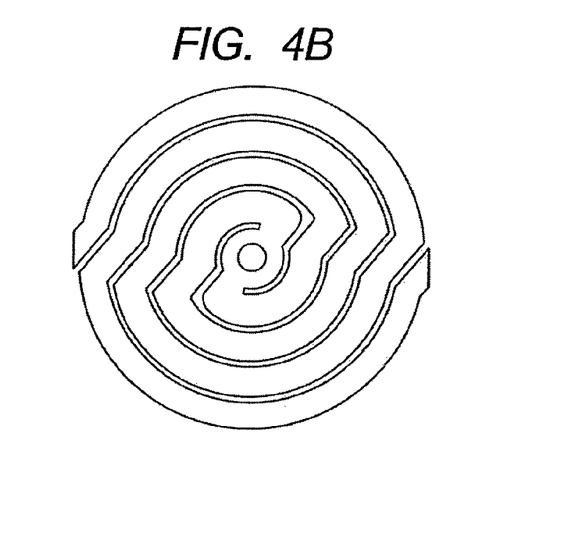
FIG. 4B is a plan view showing a configuration example of the heater electrode according to one embodiment of the present invention.
Figure 5:
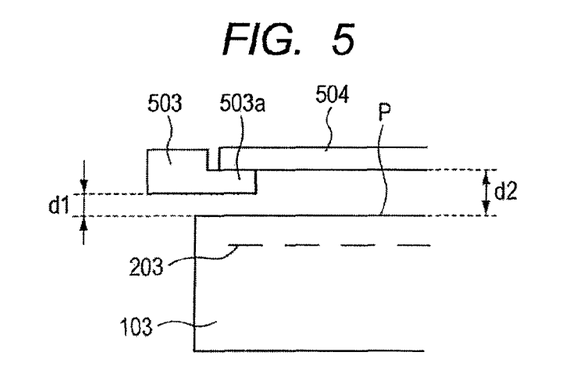
FIG. 5 is a cross-sectional view of the heater and a substrate holding device according to one embodiment of the present invention.
Figure 6:
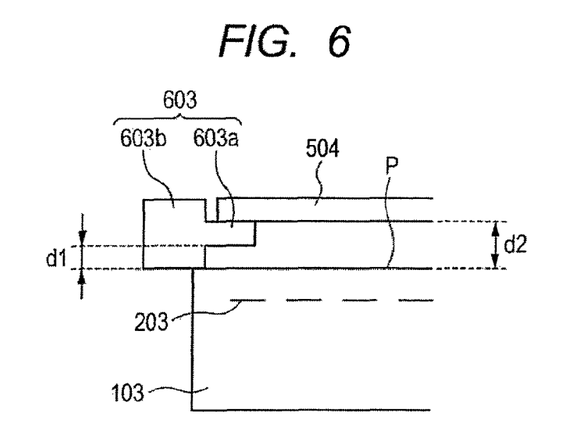
FIG. 6 is a cross-sectional view showing a second configuration example of the substrate holding device according to one embodiment of the present invention.
Figure 7:
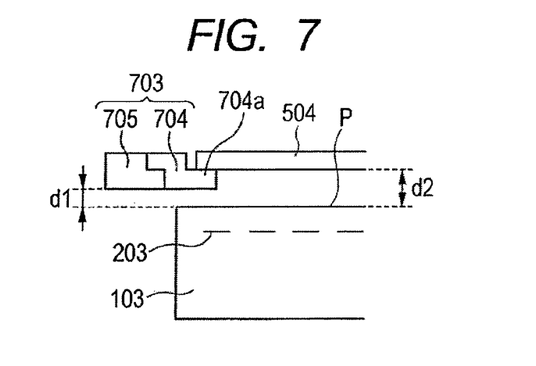
FIG. 7 is a cross-sectional view showing a third configuration example of the substrate holding device according to one embodiment of the present invention.
Figure 8:
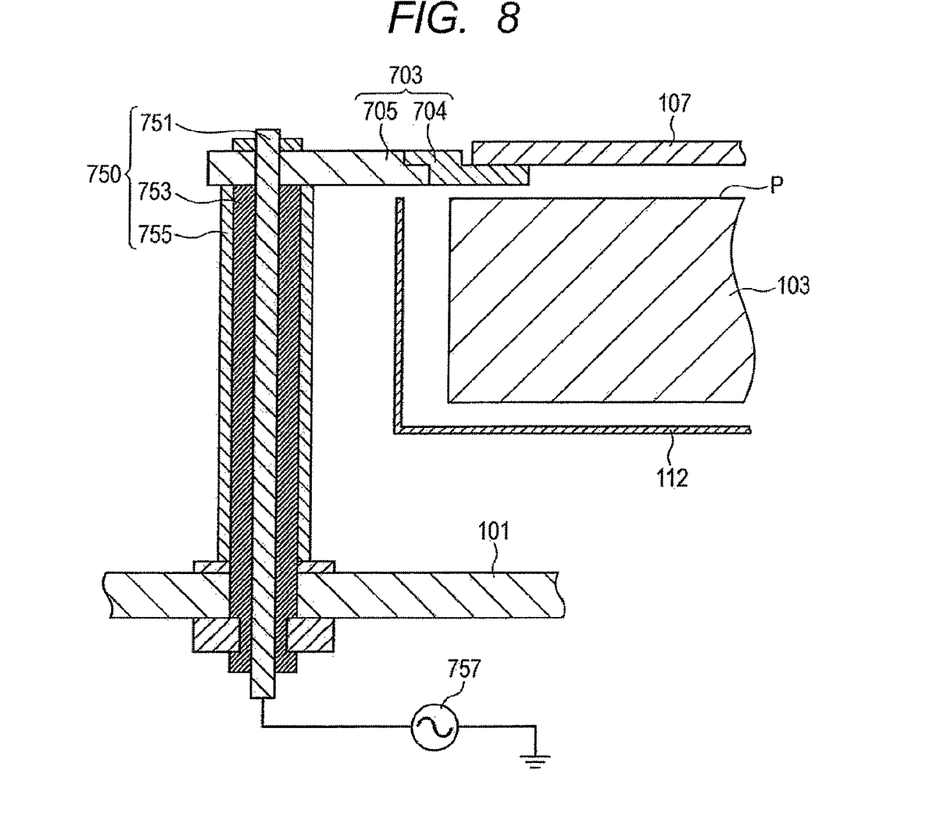
FIG. 8 is a view showing a configuration example of a holder supporting portion according to one embodiment of the present invention.
Figure 9:
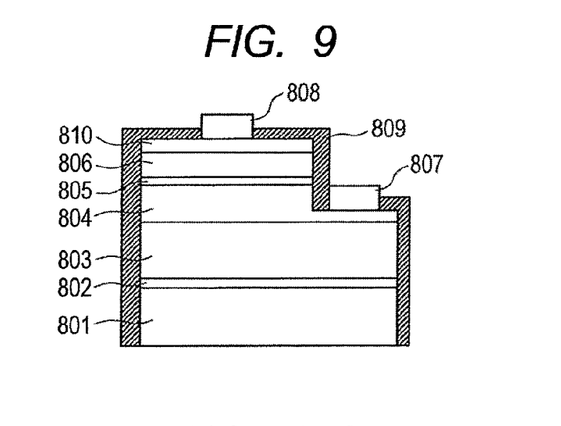
FIG. 9 is a cross-sectional view showing an example of the structure of an LED fabricated by using an epitaxial film formed by an epitaxial film forming method according to one embodiment of the present invention.

FIGS. 1 to 9 are views of a vacuum processing apparatus (radio-frequency sputtering apparatus) according to one embodiment of the present invention and of the structure of an LED fabricated by using an epitaxial film formed according to the one embodiment of the present invention. FIG. 1 is a schematic cross-sectional view of the radio-frequency sputtering apparatus. FIG. 2 is a schematic cross-sectional view of a heater. FIG. 3 is another schematic cross-sectional view of the heater. FIGS. 4A and 4B are plan views showing configuration examples of a heater electrode. FIG. 5 is a cross-sectional view of the heater and a substrate holding device. FIG. 6 is a second configuration example of the substrate holding device. FIG. 7 is a third configuration example of the substrate holding device. FIG. 8 is an enlarged view of a portion supporting the substrate holding device. FIG. 9 is a cross-sectional view of an example of the structure of the LED fabricated by using the formed epitaxial film. Note that only certain members are illustrated to avoid complication of the drawings.

FIG. 1 is a schematic configuration diagram of an example of the sputtering apparatus used for forming a Group III nitride semiconductor thin film according to the present invention. In FIG. 1 showing a sputtering apparatus S, reference numeral 101 denotes a vacuum chamber; reference numeral 102, a target electrode; reference numeral 99, a substrate holder; reference numeral 103, the heater; reference numeral 503, the substrate holding device; reference numeral 105, a target shield; reference numeral 106, a radio-frequency power source; reference numeral 107, a substrate; reference numeral 108, a target; reference numeral 109, a gas introducing mechanism; reference numeral 110, an exhaust mechanism; reference numeral 112, a reflector; reference numeral 113, an insulating member; reference numeral 114, a chamber shield; reference numeral 115, a magnet unit; reference numeral 116, a target-shield holding mechanism; and reference numeral 203, the heater electrode. Moreover, reference numeral 550 is a holder supporting portion for supporting the substrate holding device 503.

The vacuum chamber 101 is formed by using members of a metal such as stainless steel or an aluminum alloy and is electrically grounded. Moreover, with an unillustrated cooling mechanism, the vacuum chamber 101 prevents or reduces increase in the temperature of its wall surface. Further, the vacuum chamber 101 is connected to the gas introducing mechanism 109 with an unillustrated mass flow controller therebetween, and is connected to the exhaust mechanism 110 with an unillustrated variable conductance valve therebetween.

The target shield 105 is attached to the vacuum chamber 101 with the target-shield holding mechanism 116 therebetween. The target-shield holding mechanism 116 and the target shield 105 can be members of a metal such as stainless steel or an aluminum alloy and is at the same DC potential as the vacuum chamber 101.

The target electrode 102 is attached to the vacuum chamber 101 with the insulating member 113 therebetween. Moreover, the target 108 is attached to the target electrode 102, and the target electrode 102 is connected to the radio-frequency power source 106 with an unillustrated matching box therebetween. The target 108 may be attached directly to the target electrode 102 or may be attached to the target electrode 102 with an unillustrated bonding plate therebetween, the bonding plate being formed of a member of a metal such as copper (Cu).

Moreover, the target 108 may be a metal target containing at least one of Al, Ga, and In or a nitride target containing at least one of the above Group III elements. The target electrode 102 includes an unillustrated cooling mechanism for preventing increase in the temperature of the target 108. Moreover, the magnet unit 115 is located in the garget electrode 102. As the radio-frequency power source 106, one at 13.56 MHz is easy to utilize in view of industrial use. However, it is possible to use one at a different frequency or to superimpose a DC current on radio-frequency waves or to use these in the form of pulses.

The chamber shield 114 is attached to the vacuum chamber 101 and prevents adhesion of a film to the vacuum chamber 101 during film formation.

The substrate holder 99 includes the heater 103, the substrate holding device 503, and the reflector 112 as its major components. The heater 103 has the built-in heater electrode 203. The substrate holding device 503 is formed of an insulating member at least in a portion to be in contact with the substrate, and is fixed by the reflector 112, a shaft (not illustrated), or the like. Held by the substrate holding device 503, the substrate 107 can be disposed with a predetermined gap between the substrate 107 and the substrate facing surface P of the heater 103. Note that specific examples of the substrate holding device 503 will be described later.

In this embodiment, as shown in FIG. 1, in the vacuum chamber 101, the target electrode 102 on which the target can be disposed is disposed on an upper side in the direction of gravity, while the substrate holder 99 is disposed below the target electrode 102 in the direction of gravity. Thus, the substrate holding device 503 can hold the substrate 107 with the help of the gravity. Accordingly, by simply mounting the substrate 107 on a substrate supporting portion (reference numeral 503a or the like mentioned later) of the substrate holding device 503, the entire surface of the substrate 107 can be exposed to the target 108 side, and epitaxial film formation can therefore be performed on the entire surface of the substrate 107.

This embodiment shows an example where the target electrode 102 is disposed on an upper side in the direction of gravity in the vacuum chamber 101, and the substrate holder 99 is disposed below the target electrode 102 in the direction of gravity. Note, however, that it is possible to arrange the substrate holder 99 on an upper side in the direction of gravity in the vacuum chamber 101 and to dispose the target electrode 102 below the substrate holder 99 in the direction of gravity.

FIGS. 2 and 3 show structure examples of the heater 103. In FIG. 2, reference numeral 201 is a base; reference numeral 202, a base coat; reference numeral 203, the heater electrode; reference numeral 204, a back-side coat; and reference numeral 205, an over coat. Note that reference sign P is the upper surface (substrate facing surface) of the heater 103 facing the substrate being held by the later-described substrate holding device 503.

The base 201 is graphite. The heater electrode 203 and the back-side coat 204 are pyrolytic graphite (PG). The base coat 202 and the over coat 205 are pyrolytic boron nitride (PBN). Note that the base coat 202 and the over coat 205 made of PBN are high resistance materials.

By the configuration described above, the heater 103 can emit infrared rays in a predetermined wavelength range and thereby heat the substrate to a desired temperature.

FIG. 3 is another configuration example of the heater. Reference numeral 301 is a base; reference numeral 302, a heater electrode; reference numeral 303, a back-side coat; and reference numeral 304, an over coat. The base 301 is boron nitride (BN). The heater electrode 302 and the back-side coat 303 are PG. The over coat 304 is PBN. Note that the base 301 made of BN and the over coat 304 made of PBN are high resistance materials.

The above-described materials making up the heater are preferably used for their ability to heat an $\alpha$-$Al_2O_3$ substrate at a higher efficiency than conventional infrared lamps. Note, however, that the materials are not limited to these as long as they can heat an $\alpha$-$Al_2O_3$ substrate to a predetermined temperature.

FIGS. 4A and 4B show configuration examples (plan views) of the heater electrode 203 (or 302). The heater electrode 203 (or 302) incorporated in the heater 103 has an electrode pattern as shown in FIG. 4A or 4B. By connecting a power source (not illustrated) to this electrode pattern and applying a DC or AC voltage thereto, a current flows through the heater electrode 203 (or 302), and the Joule heat generated accordingly heats the heater 103. The infrared rays emitted from the heater 103 heat the substrate.

Note that the electrode pattern is not limited to FIGS. 4A and 4B. However, by using an electrode pattern as shown in FIG. 4A or 4B, heat can be supplied uniformly to the entire surface of the substrate 107. For this reason, it is desirable to use an electrode pattern which can apply heat to the entire surface of the substrate as uniformly as possible. Nonetheless, while the present invention may use an electrode pattern which can apply heat uniformly to the substrate, it is important that a +c-polarity epitaxial film can be formed, and what shape the electrode pattern is formed into is not an essential matter. Thus, in this embodiment, it is needless to say that the electrode pattern is not limited to those shown in FIGS. 4A and 4B and that this embodiment can employ any electrode pattern.

In each of the structure examples of the heater 103 shown in FIGS. 2 and 3, the substrate facing surface of the heater 103 denoted by reference sign P is the surface on the side on which the heater electrode 203 or 302 is formed with a pattern as shown in FIG. 4A or 4B. However, the heater 103 may have a structure in which the heater 103 shown in FIG. 2 or 3 is flipped upside down, that is, the surface opposite to the surface denoted by reference sign P in FIGS. 2 and 3 may serve as the substrate facing surface. In this case, the substrate is heated through the back-side coat 204 or 303. This may lower the power efficiency of the substrate heating, yet the back-side coat 204 or 303 serves to allow uniform heating, which offers an advantageous effect of uniformly applying heat to the substrate.

FIG. 5 is a cross-sectional view of the heater and the substrate holding device (first configuration example). In FIG. 5, reference numeral 103 is the heater; reference numeral 203, the heater electrode; reference numeral 503, the substrate holding device; reference numeral 504, a substrate (the holder supporting portion 550 is not illustrated). The substrate holding device 503 is a generally ring-shaped member having a uniform cross section and includes the substrate support portion 503a formed of an insulating member for supporting an outer edge portion of the substrate from below (from a lower side in the direction of gravity, i.e. from the heater 103 side). The substrate supporting portion 503a is arranged with a gap d1 between itself and the substrate facing surface P of the heater 103. Moreover, a gap d2 is provided between the substrate 504 and the substrate facing surface P of the heater 103. As described above, the substrate supporting portion 503a is provided such that the substrate 504 is disposed with a predetermined gap (e.g. d2) between itself and the substrate facing surface P of the heater 103 in a state where the substrate 504 is supported on the substrate supporting portion 503a. 0.4 mm or larger is desirably used for the gap d1, and 0.5 mm or larger is desirably used for the gap d2.

In a case where the gap d1 is smaller than 0.4 mm, a Group III nitride semiconductor thin film with mixed polarities in an outer peripheral portion is likely to be formed. In a case where the gap d2 is smaller than 0.5 mm, a Group III nitride semiconductor thin film with mixed polarities in the entire substrate surface is likely to be formed. Thus, these cases are not preferable.

As described above, the gap d1 equal to 0.4 mm or larger is provided between the lower surface of the substrate holding device 503 and the substrate facing surface P of the heater 103. Likewise, the gap d2 equal to 0.5 mm or larger is provided between the substrate 504 and the substrate facing surface P of the heater 103.

Note that it is not preferable to widen the gaps d1 and d2 too much because the wider the gaps d1 and d2, the lower the efficiency of heating the substrate 504 with the heater 103. Moreover, when the gaps d1 and d2, especially the gap d2, are widened too much, plasma may be generated in a space between the heater 103 and the substrate 504, which may possibly lead to loss of the advantageous effect of the present invention. Accordingly, the gaps d1 and d2 are set desirably to 5 mm or smaller and more desirably to 2 mm or smaller.

Other configuration examples of the substrate holding device will be described with FIGS. 6 and 7. FIG. 6 is a second configuration example of the substrate holding device. In FIG. 6, reference numeral 504 is the substrate, and reference numeral 603 is the substrate holding device (the holder supporting portion 550 is not illustrated). The substrate holding device 603 is a generally ring-shaped member having a uniform cross section and includes: a substrate supporting portion 603a formed of an insulating member for holding the substrate 504 from below; and a mounting portion 603b formed integrally with the outer periphery of the substrate supporting portion 603a. In a state where the mounting portion 603b is mounted on the substrate facing surface P of the heater 103, a gap d1 is provided between the back side of the substrate supporting portion 603a (the side facing the heater 103) and the substrate facing surface P of the heater 103, and a gap d2 is provided between the substrate 504 and the substrate facing surface P of the heater 103. 0.4 mm or larger is desirable for the gap d1, and 0.5 mm or larger is desirable for the gap d2.

FIG. 7 shows a third configuration example of the substrate holding device. In FIG. 7, reference numeral 504 is the substrate, and reference numeral 703 is the substrate holding device. The substrate holding device 703 is a generally ring-shaped member having a uniform cross section and includes a first substrate holding unit 704 and a second substrate holding unit 705. The second substrate holding unit 705 is formed of a conductive ring and is connected to an unillustrated radio-frequency power source with an unillustrated matching box therebetween. Thus, by supplying radio-frequency power to the second substrate holding unit 705 in an atmosphere containing a gas such as $N_2$ or a rare gas, plasma can be generated in the vicinity of the substrate and used to perform surface treatment on the substrate.

Moreover, the first substrate holding unit 704 includes a substrate supporting portion 704a formed of an insulating member for supporting the substrate 504 from below. A gap d1 is provided between the back side of the substrate supporting portion 704a and the substrate facing surface P of the heater 103, and a gap d2 is provided between the substrate 504 and the substrate facing surface P of the heater 103. 0.4 mm or larger is desirably used for the gap d1, and 0.5 mm or larger is desirably used for the gap d2.

Here, while a holder supporting portion 750 is not illustrated in FIG. 7, its enlarged view is shown in FIG. 8.

FIG. 8 is an enlarged view of the supporting portion (holder supporting portion 750) for the substrate holding device 703. The holder supporting portion 750 has a structure that supports the second substrate holding unit 705 and includes a conductive member 751, an insulating member 753, and a stainless pipe 755 as its major components. The conductive member 751 is electrically connected to a radio-frequency power source 757 provided outside the vacuum chamber 101 and to the second substrate holding unit 705. Thus, radio-frequency power is supplied to the second substrate holding unit 705 from the radio-frequency power source 757 through the conductive member 751. The conductive member 751 is covered with the insulating member 753 and the stainless pipe 755. Moreover, electrical insulation between the conductive member 751 and the vacuum chamber 101 is secured by the insulating member 753 as well. As described above, the holder supporting portion 750 is configured to support the second substrate holding unit 705 and also to supply power to the second substrate holding unit 705.

The holder supporting portion 750 shown in FIG. 8 has a structure including the conductive member 751 for supplying radio-frequency power to the second substrate holding unit 705. Note, however, that the conductive member 751 is not necessary for the holder supporting portion 550 (see FIG. 1) that supports the substrate holding device 503 or 603.

In the first to third configuration examples (FIGS. 5 to 7) of the substrate holding device, ring-shaped insulating members are used as the substrate supporting portions 503a, 603a, and 704a. Note, however, that they may not be in a ring shape. For example, each of the substrate supporting portions 503a, 603a, and 704a may be a plate-shaped insulating member with no opening formed therein. In this case, too, the substrate supporting portion is disposed with a predetermined gap (e.g. d1) between itself and the heater 103, as a matter of course. Nonetheless, forming the substrate supporting portion in a ring shape as in this embodiment enables the substrate 107 to be exposed to the heater 103 while the substrate 107 and the substrate facing surface P of the heater 103 are disposed with a predetermined gap therebetween. This allows efficient heating of the substrate 107. Thus, forming the substrate supporting portion into a ring shape is a preferred mode.

Moreover, quartz, sapphire, alumina, or the like, for example, can be used for the insulating members used as the substrate supporting portions 503a, 603a, and 704a.

As the structure of the heater 103, any of the structures shown in FIGS. 2 and 3 may be used, or a structure obtained by flipping any of these structures upside down may be used. Some other structure may be used instead since the heater structure is not an essential matter in this embodiment. It is even possible to employ a heater structure in which the heater electrode is disposed on the substrate facing surface P of the heater with nothing on top.

As the structure of each of the substrate holding devices 503, 603, and 703, any of the structures shown in FIGS. 5, 6, and 7 may be used, or a substrate holding device with some other structure may be used instead. What is important in this embodiment is that the substrate should be disposed away from the substrate facing surface P of the heater by a predetermined distance during the formation of a Group III nitride semiconductor thin film. In this embodiment, there is a gap in a space between the substrate facing surface P of the heater and the substrate, but a similar advantageous effect is considered to be obtainable even when an insulating member is inserted in this gap. Accordingly, it is possible to use a substrate holding device with any structure other than those in FIGS. 5 to 7, as long as it is a structure that allows the substrate to be disposed away from the substrate facing surface P of the heater by a predetermined distance. For example, in a case of a device including a mechanism configured to handle a substrate by moving lift pins up and down, the lift pins may be used to hold the substrate at a position with a predetermined gap between the substrate and the substrate facing surface P of the heater 103. In this case, however, the film enters a gap between the outer periphery of the substrate and the heater 103 and adheres to the substrate facing surface P of the heater 103, thereby changing the radiation from the heater 103 over time. Thus, this embodiment is a desirable mode.

Moreover, before the formation of a Group III nitride semiconductor thin film, the radio-frequency power source 757 connected to the second substrate holding unit 705 shown in FIG. 7 (the third configuration example) may be used to generate plasma in the vicinity of the substrate and remove components such as moisture and hydrocarbons adhering to the substrate surface. Further, as the structure of the heater electrode, any of the patterns shown in FIGS. 4A and 4B may be used, or some other structure pattern may be used as mentioned above.

The structure in FIG. 6 is preferably used over the structure in FIG. 5 for its ease in accurately controlling the gaps d1 and d2 between the structure and the substrate facing surface P of the heater 103. Moreover, when the structure in FIG. 7 is used, it is possible to remove components such as moisture and hydrocarbons adhering to the substrate surface and therefore improve the reproducibility of the Group III nitride semiconductor thin film in terms of crystallinity. Thus, the structure in FIG. 7 is preferably used.

FIG. 9 is an example of the cross-sectional structure of a light emitting diode (LED) fabricated as a semiconductor light emitting element by using a method of manufacturing a Group III nitride semiconductor thin film according to the present invention. In FIG. 9, reference numeral 801 is an α-$Al_2O_3$ substrate; reference numeral 802, a buffer layer; reference numeral 803, a Group III nitride semiconductor intermediate layer; reference numeral 804, an n-type Group III nitride semiconductor layer; reference numeral 805, a Group III nitride semiconductor active layer; reference numeral 806, a p-type Group III nitride semiconductor layer; reference numeral 807, a n-type electrode; reference numeral 808, a p-type bonding pad electrode; reference numeral 809, a protection layer; and reference numeral 810, a light transmissive electrode.

AlN, AlGaN, or GaN is preferably used as the material making up the buffer layer 802. AlGaN, GaN, and InGaN are preferably used as the materials making up the Group III nitride semiconductor intermediate layer 803, the n-type Group III nitride semiconductor layer 804, the Group III nitride semiconductor active layer 805, and the p-type Group III nitride semiconductor layer 806. As for the n-type Group III nitride semiconductor layer 804, its material described above is preferably doped with a small amount of silicon (Si) or germanium (Ge). As for the p-type Group III nitride semiconductor layer 806, its material described above is preferably doped with a small amount of magnesium (Mg) or zinc (Zn). In this way, their electrical conductivity can be controlled. Further, as the Group III nitride semiconductor active layer 805, it is desirable to form a multiple quantum well (MQW) structure with some of the above-described materials. In addition, the above-described light emitting diode (LED) can be used to form an illuminating device.

Hereinbelow, an epitaxial film forming method of a Group III nitride semiconductor thin film will be described by using the sputtering apparatus according to the present invention with reference to the drawings. In this embodiment, an epitaxial film is formed on an $\alpha$-$Al_2O_3$ substrate by a method including the following first to fourth steps.

Firstly, in the first step, the substrate 107 is introduced into the vacuum chamber 101 which is maintained to a predetermined pressure by the exhaust mechanism 110. In this step, an unillustrated handling robot transports the substrate ($\alpha$-$Al_2O_3$ substrate) 107 to an upper side of the heater 103 and mounts the substrate 107 on top of unillustrated lift pins protruding from the heater 103. Then, the lift pins holding the substrate 107 are lowered, so that the substrate 107 is disposed on the substrate holding device 503.

Subsequently, in the second step, the substrate 107 is maintained at a predetermined temperature by controlling the voltage to be applied to the heater electrode 203 incorporated in the heater 103. In this step, a thermocouple (not illustrated) incorporated in the heater 103 is used to monitor the temperature of the heater 103, or an unillustrated pyrometer arranged in the vacuum chamber 101 is used to monitor the temperature of the heater 103, and the temperature is controlled to the predetermined temperature.

Subsequently, in the third step, any of an $N_2$ gas, a rare gas, and a mixed gas of an $N_2$ gas and a rare gas is introduced into the vacuum chamber 101 through the gas introducing mechanism 109, and the pressure in the vacuum chamber 101 is set to a predetermined pressure by means of the mass flow controller (not illustrated) and the variable conductance valve (not illustrated).

Lastly, in the fourth step, radio-frequency power is applied from the radio-frequency power source 106 to generate radio-frequency plasma in front of the target 108, and ions in the plasma sputter the element making up the target 108, thereby forming a Group III nitride semiconductor thin film. Note that in a case of using a metal target as the target 108, an $N_2$ gas or a mixed gas of an $N_2$ gas and a rare gas is preferably used as the process gas. Then, the group III element making up the metal target is nitrided in at least one of regions that include the surface of the target 108, the surface of the substrate 107, and the space between the target 108 and the substrate 107. As a result, a Group III nitride semiconductor thin film is formed on the substrate.

On the other hand, in a case of using a nitride target, any of an $N_2$ gas, a rare gas, and a mixed gas of an $N_2$ gas and a rare gas is preferably used. Then, sputtered particles are emitted from the target surface in the form of atoms or nitride molecules. The Group III element emitted from the target surface in the form of atoms is nitrided in at least one of the regions that include the surface of the target 108, the surface of the substrate 107, and the space between the target 108 and the substrate 107. As a result, a Group III nitride semiconductor thin film is formed on the substrate. On the other hand, most of the nitride molecules emitted from the target surface reach the substrate and form a Group III nitride semiconductor thin film.

Part of the nitride molecules emitted from the target surface may possibly be dissociated at the surface of the substrate 107 or in the space between the target 108 and the substrate 107. However, the Group III element produced by the dissociation is nitrided again at the surface of the substrate 107 or in the space between the target 108 and the substrate 107 and forms a Group III nitride semiconductor thin film.

The predetermined pressure in the first step is desirably below $5 \times 10^{-4}$ Pa. When the predetermined pressure is at or above $5 \times 10^{-4}$ Pa, impurities such as oxygen are taken into the Group III nitride semiconductor thin film, making it difficult to obtain a fine epitaxial film. Moreover, the temperature of the heater 103 in the first step is not particularly limited but is desirably set to a temperature that helps to obtain a substrate temperature used in the film formation in view of productivity.

The predetermined temperature in the second step is desirably set to a film formation temperature in the fourth step in view of productivity. Moreover, the predetermined pressure in the third step is desirably set to a film formation pressure in the fourth step in view of productivity. The timings to perform the second step and the third step may be switched, or the steps may be performed simultaneously. Moreover, the temperature set in the second step and the pressure set in the third step are desirably maintained at least until the start of the fourth step in view of productivity.

A substrate temperature during the fourth step is set desirably within a range from 100 to 1200° C. and more desirably within a range from 400 to 1000° C. In a case of below 100° C., likely to be formed is a film in which an amorphous structure exists in a mixed state. In a case of a temperature above 1200° C., no film is formed at all, or even if a film is formed, likely to be obtained is an epitaxial film with many defects attributable to thermal stress. Moreover, the film formation pressure is set desirably within a range from 0.1 to 100 mTorr ($1.33 \times 10^{-2}$ to $1.33 \times 10^{1}$ Pa) and more desirably within a range from 1.0 to 10 mTorr ($1.33 \times 10^{-1}$ to 1.33 Pa).

In a case of below 0.1 mTorr ($1.33 \times 10^{-2}$ Pa), high energy particles are likely to fall on the substrate surface, making it difficult to obtain a fine Group III nitride semiconductor thin film. In a case of a pressure above 100 mTorr ($1.33 \times 10^{1}$ Pa), the film formation rate is extremely low. Thus, these cases are not preferable. At the time of starting the fourth step, it is possible to temporarily increase the pressure in the vacuum chamber 101 to the film formation pressure or above to facilitate the generation of plasma. In this case, the film formation pressure may be increased by temporarily increasing the flow rate of at least one of the gases in the process gas. Alternatively, the film formation pressure may be increased by temporarily reducing the opening degree of the variable conductance valve (not illustrated).

Further, before the first step, there may be steps of transporting the substrate 107 to a pre-processing chamber (not illustrated) and performing heat treatment or plasma processing on the substrate 107 at a temperature equal to or above the film formation temperature, as a matter of course.

Examples of an epitaxial film of a Group III nitride semiconductor thin film formed by the method according to this embodiment include the buffer layer 802, the Group III nitride semiconductor intermediate layer 803, the n-type Group III nitride semiconductor layer 804, the Group III nitride semiconductor active layer 805, and the p-type Group III nitride semiconductor layer 806 shown in FIG. 9. All these layers may be fabricated by using the sputtering apparatus (epitaxial film forming method) according to the present invention, or some, particular layer(s) may be fabricated by using the sputtering apparatus (epitaxial film forming method) according to the present invention.

For instance, as a first example of a process for the LED element in FIG. 9, a method includes fabricating the buffer layer 802 by use of the sputtering apparatus (epitaxial film forming method) according to the present invention, and then sequentially stacking the Group III nitride semiconductor intermediate layer 803, the n-type Group III nitride semiconductor layer 804, the Group III nitride semiconductor active layer 805, and the p-type Group III nitride semiconductor layer 806 by use of MOCVD, to thereby fabricate an epitaxial wafer.

Moreover, as a second example, a method includes fabricating the buffer layer 802 and the Group III nitride semiconductor intermediate layer 803 by use of the sputtering apparatus (epitaxial film forming method) according to the present invention, and then sequentially stacking the n-type Group III nitride semiconductor layer 804, the Group III nitride semiconductor active layer 805, and the p-type Group III nitride semiconductor layer 806 by use of MOCVD, to thereby fabricate an epitaxial wafer.

As a third example, a method includes fabricating the buffer layer 802, the Group III nitride semiconductor intermediate layer 803, and the n-type Group III nitride semiconductor layer 804 by use of the sputtering apparatus (epitaxial film forming method) according to the present invention, and then sequentially stacking the Group III nitride semiconductor active layer 805 and the p-type Group III nitride semiconductor layer 806 by use of MOCVD, to thereby fabricate an epitaxial wafer.

As a fourth example, a method includes fabricating the buffer layer 802, the Group III nitride semiconductor intermediate layer 803, the n-type Group III nitride semiconductor layer 804, and the Group III nitride semiconductor active layer 805 by use of the sputtering apparatus (epitaxial film forming method) according to the present invention, and then fabricating the p-type Group III nitride semiconductor layer 806 by use of MOCVD, to thereby fabricate an epitaxial wafer.

As a fifth example, a method includes fabricating the buffer layer 802, the Group III nitride semiconductor intermediate layer 803, the n-type Group III nitride semiconductor layer 804, the Group III nitride semiconductor active layer 805, and the p-type Group III nitride semiconductor layer 806 by use of the sputtering apparatus (epitaxial film forming method) according to the present invention, to thereby fabricate an epitaxial wafer.

A lithography technique and a RIE (reactive ion etching) technique are applied to the epitaxial wafer thus obtained to form the light transmissive electrode 810, the p-type bonding pad electrode 808, the n-type electrode 807, and the protection film 809 as shown in FIG. 9. As a result, the LED structure can be obtained. Note that the materials of the light transmissive electrode 810, the p-type bonding pad electrode 808, the n-type electrode 807, and the protection film 809 are not particularly limited, and materials well known in this technical field can be used without any limitations.

FIRST EXAMPLE

As a first example of the present invention, description will be given of an example where an AlN film is formed on an $\alpha$-$Al_2O_3$ (0001) substrate by using the method of forming a Group III nitride semiconductor thin film according to the present invention. More specifically, description will be given of an example where an AlN film is formed by using sputtering on an $\alpha$-$Al_2O_3$ (0001) substrate mounted with a gap between the substrate and the substrate facing surface of a heater with the help of a substrate holding device. Note that in this example, the AlN film was formed by using a similar sputtering apparatus to that in FIG. 1. A similar heater structure to that in FIG. 2, a similar heater electrode pattern to that in FIG. 4A, and a similar substrate holding device to that in FIG. 5 were used. Moreover, the gap d1 between the substrate supporting portion 503a and the substrate facing surface P of the heater 103 in FIG. 5 was set to 1 mm, and the gap d2 between the substrate 504 and the substrate facing surface P of the heater 103 in FIG. 5 was set to 2 mm.

In this example, firstly, in the first step, the $\alpha$-$Al_2O_3$ (0001) substrate was transported into the vacuum chamber 101 maintained at or below $1\times10^{-4}$ Pa and was disposed on the substrate holding device 503. In the second step, the substrate was maintained at 550° C. which was the film formation temperature in the fourth step. In this step, the heater 103 was controlled such that the monitoring value of the thermocouple incorporated therein would be 750° C. Subsequently, in the third step, a mixed gas of $N_2$ and Ar was introduced such that $N_2/(N_2+Ar)$ would be 25%, and the pressure in the vacuum chamber 101 was set to 3.75 mTorr (0.5 Pa) which was the film formation pressure in the fourth step. Under this condition, in the fourth step, sputtering was performed by applying a radio-frequency power of 2000 W from the radio-frequency power source 106 to the target 108 made of the metal Al. As a result, an AlN film with a thickness of 50 nm was formed on the substrate.

Note that the film formation temperature in this example is set by performing, in advance, substrate temperature measurement on the $\alpha$-$Al_2O_3$ (0001) substrate in which a thermocouple is buried, and studying the relation between the temperature of the $\alpha$-$Al_2O_3$ (0001) substrate and the monitoring value of the thermocouple incorporated in the heater, i.e., the temperature of the heater, at that moment.

In this example, the AlN film thus fabricated was evaluated through: X-ray diffraction (XRD) measurement in a 2θ/ωs-can mode at symmetrical reflection positions; XRC measurement in an ω scan mode with respect to a symmetrical plane; XRC measurement in a φ scan mode in an in-plane arrangement; and coaxial impact collision ion scattering spectroscopy (CAICISS) measurement. Here, the XRD measurement in the 2θ/ω scan mode at the symmetrical reflection positions was used to check the crystalline orientation, and the XRC measurement in the ω scan mode with respect to the symmetrical plane and the XRC measurement in the φ scan mode in the in-plane arrangement were used to evaluate the tilt and twist mosaic spreads, respectively. Moreover, the CAICISS measurement was used as means for determining the polarity.

First, the AlN film fabricated in this example was subjected to the XRD measurement in the 2θ/ω scan mode at the symmetrical reflection positions in a measurement range of 2θ=20 to 60°. As a result, only diffraction peaks of AlN (0002) plane and $\alpha$-$Al_2O_3$ (0006) plane were observed, and diffraction peaks indicating other lattice planes of AlN were not observed. From this fact, the obtained AlN film was found to be oriented in the c-axis direction.

Next, the AlN film fabricated in this example was subjected to the XRC measurement in the 2θ/ω scan mode with respect to the symmetrical plane. Note that AlN (0002) plane was used in the measurement. The FWHM of the obtained XRC profile was 450 arcsec or smaller in a case where a detector was in an open detector state, and was 100 arcsec or smaller in a case where analyzer crystals were inserted to the detector. Thus, it was observed that the tilt mosaic spread of the fabricated AlN film was significantly small. Moreover, under other fabricating conditions, films with a FWHM equal to or smaller than 20 arcsec were found in the XRC measurement with the analyzer crystals being inserted to the detector.

As a rule, XRC measurement should be performed with a detector being in an open detector state. However, in a case of a sample with a small film thickness as in this example, its thickness effect and lattice relaxation widen the FWHM of the XRC profile, thus making it difficult to perform accurate mosaic spread evaluation. For this reason, these days, inserting analyzer crystals to a detector as described above is regarded as XRC measurement in a broad sense. The following will assume that the XRC measurement is performed by using the open detector state, unless otherwise mentioned.

Next, the AlN film fabricated in this example was subjected to the XRC measurement in the $\phi$ scan mode in the in-plane arrangement. Note that AlN {10-10} plane was used in the measurement. In the obtained XRC profile, six diffraction peaks appeared at 60° intervals. Thus, it was observed that the AlN film had a hexagonal symmetry, in other words, the AlN film was epitaxially grown. Moreover, a FWHM figured out from the diffraction peak with the largest intensity was 2.0° or smaller. Thus, it was found that the twist mosaic spread of the fabricated AlN film was relatively small. Note that from a comparison of the in-plane crystalline orientation between the $\alpha$-$Al_2O_3$ (0001) substrate and the AlN film, it was observed that the a axis of the AlN film was turned in an in-plane direction by 30° with respect to the a axis of the $\alpha$-$Al_2O_3$ (0001) substrate. This indicates that the AlN film was formed in a common epitaxial relation which is observed when an AlN film is epitaxially grown on an $\alpha$-$Al_2O_3$ (0001) substrate.

Figure 12:
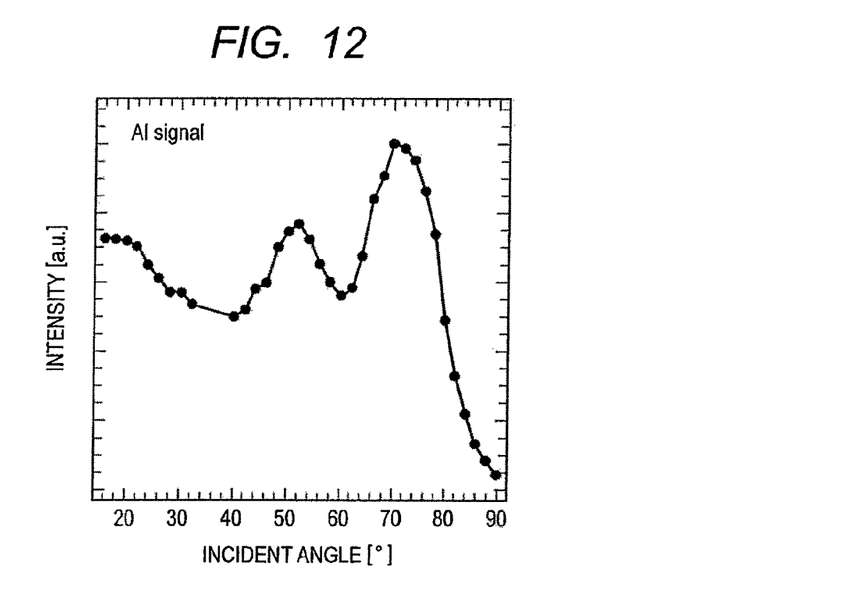
FIG. 12 is a diagram showing the measurement result of CAICISS measurement on a Group III nitride semiconductor thin film according to one embodiment of the present invention.

FIG. 12 is the result of the CAICISS measurement performed on the AlN film fabricated in this example. In this measurement, an Al signal is detected with the incident angle being varied from AlN [11-20] direction. It can be seen that a peak around an incident angle of 70° appears in a single form. This fact indicates that the obtained AlN film has +c polarity (Al polarity).

From the above facts, it was observed that the AlN film fabricated in this example was a c-axis oriented epitaxial film having +c polarity (Al polarity) and also having a significantly small tilt mosaic spread. In other words, it was demonstrated that the present invention could provide a Group III nitride semiconductor thin film having reduced tilt and twist mosaic spreads and also having +c polarity.

Further, in this example, there is no need for covering part of the film forming surface of the substrate 107 with supporting members (e.g. supporting claws) or the like for holding the substrate 107, because the target electrode 102 for holding the target is disposed on an upper side in the direction of gravity while the substrate holder 99 is disposed on a lower side in the direction of gravity as shown in FIG. 1. Thus, the entire film forming surface of the substrate 107 can be exposed to the target 108. Hence, according to this example, a Group III nitride semiconductor thin film having reduced tilt and twist mosaic spreads and also uniform +c polarity can be formed on the entire film forming surface of the substrate 107.

SECOND EXAMPLE

Next, as a second example of the present invention, description will be given of an example where an AlN film is fabricated as a buffer layer by using the method of forming a Group III nitride semiconductor thin film according to the present invention, and then an undoped GaN film is formed on the buffer layer by using MOCVD.

An AlN film was formed by using sputtering on an $\alpha$-$Al_2O_3$ (0001) substrate under the same conditions as the first example. Then, the wafer was introduced into a MOCVD apparatus to form an undoped GaN film of a film thickness of 5 μm.

The surface of the undoped GaN film thus obtained was a mirror surface. XRD measurement in a 2θ/ω scan mode at symmetrical reflection positions showed that the undoped GaN film was orientated in the c-axis direction. Next, XRC measurement in an ω scan mode using GaN (0002) plane as a symmetrical plane, and XRC measurement in a $\phi$ scan mode with respect to GaN {10-10} plane in an in-plane arrangement were performed. As a result, it was observed that the FWHMs in the measurements were 250 arcsec or smaller and 500 arcsec or smaller, respectively. From these facts, it was found that the obtained undoped GaN film was obtained as high-quality crystals with small tilt and twist mosaic spreads. Further, from CAICISS measurement, it was observed that the polarity of the obtained undoped GaN film was +c polarity (Ga polarity). It can be considered that this is because the polarity of the AlN film used as the buffer layer can be controlled to be +c polarity as described in the first example, and therefore the undoped GaN film formed thereon inherits that polarity as well.

From the above facts, when an AlN film controlled to have +c polarity is fabricated as a buffer layer by using the method of forming a Group III nitride semiconductor thin film according to the present invention, an undoped GaN film grown thereon by using MOCVD can be obtained as a high-quality epitaxial film having small mosaic spreads and controlled to have +c polarity. In other words, a +c-polarity Group III nitride semiconductor thin film can be epitaxially grown on an $\alpha$-$Al_2O_3$ substrate.

Note that while the undoped GaN film was formed by MOCVD in this example, it was observed that a similar result could be obtained by using sputtering instead.

THIRD EXAMPLE

As a third example of the present invention, description will be given of an example where: an AlN film is fabricated as a buffer layer by using the method of forming a Group III nitride semiconductor thin film according to the present invention; then, a Group III nitride semiconductor intermediate layer made of undoped GaN, an n-type Group III nitride semiconductor layer made of Si-doped GaN, a Group III nitride semiconductor active layer having a MQW structure with InGaN and GaN, and a p-type Group III nitride semiconductor layer made of Mg-doped GaN are epitaxially grown on the buffer layer sequentially by using MOCVD; further, an n-type electrode layer, a light transmissive electrode, a p-type electrode layer, and a protection film are formed; and thereafter, the wafer is divided by scribing to fabricate LED elements.

An AlN film was formed by using sputtering on an $\alpha$-$Al_2O_3$ (0001) substrate under the same conditions as the first example. Then, the wafer was introduced into a MOCVD apparatus to form: a Group III nitride semiconductor intermediate layer with a film thickness of 5 μm made of an undoped GaN; an n-type Group III nitride semiconductor layer with a film thickness of 2 μm made of Si-doped GaN; a Group III nitride semiconductor active layer having a MQW structure which is a layered structure starting with GaN and ending with GaN and in which five layers of InGaN each having a film thickness of 3 nm and six layers of GaN each having a film thickness of 16 nm are stacked alternately; and a p-type Group III nitride semiconductor layer with a film thickness of 200 nm made of Mg-doped GaN.

A lithography technique and a RIE technique were applied to the epitaxial wafer thus obtained to form the light transmissive electrode 810, the p-type bonding pad electrode 808, the n-type electrode 807, and the protection film 809 as shown in FIG. 9. Note that in this example, ITO (Indium-Tin-Oxide) was used as the light transmissive electrode; a structure in which titanium (Ti), Al, and gold (Au) were stacked was used as the p-type boding pad electrode; a structure in which nickel (Ni), Al, Ti, and Au were stacked was used as the n-type electrode; and $SiO_2$ was used as the protection film.

The wafer in which the obtained LED structure was formed as described above was divided by scribing into LED chips of a size of 350 μm². Then, each LED chip was mounted on lead frames and wired to the lead frames with metal wires. As a result, an LED element was formed.

A forward current was caused to flow between the p-type bonding pad electrode and the n-type electrode of the LED element thus obtained. As a result, the LED element exhibited good light emission characteristics, namely, a forward voltage of 3.0 V, a light emission wavelength of 470 nm, and a light emission output of 15 mW when the current was 20 mA. Such characteristics were found in the LED elements fabricated from almost the whole surface of the fabricated wafer without variations.

From the above fact, an LED element having good emission characteristics could be obtained by fabricating an AlN film controlled to have +c polarity as a buffer layer by using the method of forming a Group III nitride semiconductor thin film according to the present invention. In this example, the Group III nitride semiconductor intermediate layer made of undoped GaN, the n-type Group III nitride semiconductor layer made of Si-doped GaN, the Group III nitride semiconductor active layer having the MQW structure with InGaN and GaN, and the p-type Group III nitride semiconductor layer made of Mg-doped GaN were formed by MOCVD. Note, however, that it was observed that a similar result could be obtained by using sputtering instead to fabricate these layers.

FIRST COMPARATIVE EXAMPLE

As a first comparative example of the present invention, description will be given of an example where an AlN film is formed by using sputtering on an $\alpha\text{-}Al_2O_3$ (0001) substrate mounted in contact with a heater, i.e. without using the substrate holding device which is a characteristic feature of the present invention. Note that in this comparative example, the AlN film was formed by using the same sputtering apparatus, heater, and heater electrode as those in the first example, except for the substrate mounting manner (disposing an $\alpha\text{-}Al_2O_3$ (0001) substrate with a gap between the substrate and the heater). Moreover, as for the film forming conditions of the AlN film, too, the same conditions as those in the first example were used.

The AlN film fabricated in this comparative example was subjected to XRD measurement in a 2θ/ω scan mode at symmetrical reflection positions, XRC measurement in an ω scan mode with respect to AlN (0002) plane (in a state where analyzer crystals were inserted to a detector and in an open detector state), and XRC measurement in a φ scan mode with respect to AlN {10-10} plane. Like the AlN film obtained in the first example, it was found that an epitaxial film oriented in the c-axis direction was obtained, and the tilt and twist mosaic spreads were substantially the same. On the other hand, CAICISS measurement performed on the AlN film fabricated in this comparative example showed that the AlN film was a film in which +c polarity (Al polarity) and −c polarity (N polarity) existed in a mixed state.

The above facts demonstrated that a +c-polarity Group III nitride semiconductor thin film could not be obtained when the $\alpha\text{-}Al_2O_3$ (0001) substrate was mounted in contact with the heater.

SECOND COMPARATIVE EXAMPLE

Next, as a second comparative example of the present invention, description will be given of an example where a buffer layer made of AlN is formed by using sputtering on an $\alpha\text{-}Al_2O_3$ (0001) substrate mounted in contact with the upper side of a heater, and then an undoped GaN film is formed thereon by using MOCVD. Note that in this comparative example, the buffer layer made of AlN was formed by using the same sputtering apparatus, heater, heater electrode, and film forming conditions as those in the first comparative example. The undoped GaN film was formed under similar conditions to those in the second example.

A buffer layer made of AlN was formed on an $\alpha\text{-}Al_2O_3$ (0001) substrate by using sputtering with use of the same sputtering apparatus, heater, heater electrode, and film forming conditions as those in the first comparative example. Then, the wafer was introduced into a MOCVD apparatus to form an undoped GaN film with a film thickness of 5 μm.

The surface of the undoped GaN film thus obtained was white, and XRD measurement in a 2θ/ω scan mode at symmetrical reflection positions showed that the undoped GaN film was oriented in the c-axis direction. Next, XRC measurement in an ω scan mode with respect to GaN (0002) plane being a symmetrical plane, and XRC measurement in a φ scan mode with respect to GaN {10-10} plane were performed. As a result, it was observed that the FWHMs in the measurements were about 360 arcsec and about 1000 arcsec, respectively. From these facts, it was found that the undoped GaN film obtained in this comparative example was obtained as low-quality crystals with larger tilt and twist mosaic spreads than the undoped GaN film obtained in the second example.

Further, from CAICISS measurement, it was observed that the obtained undoped GaN film was a film in which +c polarity (Ga polarity) and −c polarity (N polarity) existed in a mixed state. As has been described in the comparative first example, it can be considered that this is because the polarity of the buffer layer made of AlN is a film in which +c polarity and −c polarity exist in a mixed state, and therefore the undoped GaN film formed thereon inherits the mixed polarities as well.

From the above facts, when a buffer layer made of AlN is formed by sputtering in which an $\alpha\text{-}Al_2O_3$ (0001) substrate is mounted in contact with a heater, an undoped GaN film grown thereon by using MOCVD is obtained as a low-quality epitaxial film. Note that while the undoped GaN film was formed by MOCVD in this comparative example, it was observed that a similar result could be obtained by using sputtering instead.

THIRD COMPARATIVE EXAMPLE

As a third comparative example of the present invention, description will be given of an example where: a buffer layer made of AlN is formed by sputtering in which an $\alpha\text{-}Al_2O_3$ (0001) substrate is mounted in contact with a heater; then, a Group III nitride semiconductor intermediate layer made of undoped GaN, an n-type Group III nitride semiconductor layer made of Si-doped GaN, a Group III nitride semiconductor active layer having a MQW structure with InGaN and GaN, and a p-type Group III nitride semiconductor layer made of Mg-doped GaN are epitaxially grown on the buffer layer sequentially by using MOCVD; further, an n-type electrode layer, a light transmissive electrode, a p-type electrode layer, and a protection film are formed; and thereafter, the wafer is divided by scribing to fabricate LED elements. Note that the method of forming the buffer layer made of AlN is similar to that in the first comparative example. The Group III nitride semiconductor intermediate layer made of undoped GaN, the n-type Group III nitride semiconductor layer made of Si-doped GaN, the Group III nitride semiconductor active layer having the MQW structure with InGaN and GaN, and the p-type Group III nitride semiconductor layer made of Mg-doped GaN, which are formed by using MOCVD, are all similar to those in the third example. Moreover, the material and the film forming method of each of those formed thereafter, namely, the n-type electrode layer, the light transmissive electrode, the p-type electrode layer, and the protection film, as well as the following steps of forming elements, are all similar to those in the third example.

A forward current was caused to flow between the p-type bonding pad electrode and the n-type electrode of an LED electrode thus obtained. As a result, good diode characteristics were not obtained from the LED element. Moreover, the element characteristics obtained were poor such that, for example, a sufficient light emission intensity could not be obtained in a visible range. Similar characteristics were found in the LED elements fabricated from almost the whole surface of the fabricated wafer.

The above facts demonstrate that an LED element having good light emission characteristics cannot be obtained when a buffer layer made of AlN is formed by sputtering in which an $\alpha$-$Al_2O_3$ (0001) substrate is mounted in contact with a heater. In this example, the Group III nitride semiconductor intermediate layer made of undoped GaN, the n-type Group III nitride semiconductor layer made of Si-doped GaN, the Group III nitride semiconductor active layer having the MQW structure with InGaN and GaN, and the p-type Group III nitride semiconductor layer made of Mg-doped GaN were formed by MOCVD. Note, however, that it was observed that a similar result could be obtained by using sputtering instead.

As described above, a major characteristic feature of the present invention is that it focuses on how a substrate should be mounted in order to form a +c-polarity Group III nitride semiconductor epitaxial film on an $\alpha$-$Al_2O_3$ substrate. To obtain this epitaxial film with uniform +c polarity, an improvement is added to a substrate holder, specifically, the relation between the position of a substrate held by a substrate holder and the position of a heater included in the substrate holder is set to a particular relation. This is a technical idea not found in conventional techniques.

In the present invention, according to the above-described technical idea unique to the present invention, a substrate holder is provided with a substrate holding device (substrate supporting portion) for disposing a substrate away from the substrate facing surface of a heater by a predetermined distance, and the substrate is set away from the substrate facing surface of the heater during formation of a Group III nitride semiconductor thin film. With the substrate holder configured in this way, a Group III nitride semiconductor thin film having reduced tilt and twist mosaic spreads and also having uniform +c polarity can be formed by sputtering, as shown in the first to third examples and first to third comparative examples described above.

Note that while the embodiment and examples described above have shown the cases where only the substrate is introduced into the vacuum chamber, the substrate may be introduced by using a tray. According to the idea of the present invention, when the tray with the substrate mounted thereon is disposed on the substrate holding device, the substrate and the tray with the substrate mounted thereon should be disposed away from the heater by a predetermined distance. Alternatively, the substrate may be introduced by using the substrate holding device 503 or 603 or the substrate supporting portion 704 as a tray.

The invention claimed is:

1. An epitaxial film forming method of epitaxially growing a Group III nitride semiconductor thin film by sputtering on an $\alpha$-$Al_2O_3$ substrate heated to a desired temperature by using a heater, the method comprising:
   holding the $\alpha$-$Al_2O_3$ substrate away from a substrate facing surface of the heater by 0.5-5 mm; and
   forming an epitaxial film of a Group III nitride semiconductor thin film by sputtering on the $\alpha$-$Al_2O_3$ substrate in a state of being held away from the substrate facing surface by 0.5-5 mm, the epitaxial film having +c polarity.

2. A semiconductor light emitting element manufacturing method comprising the epitaxial film forming method according to claim 1.

3. A semiconductor light emitting element comprising an epitaxial film of a Group III nitride semiconductor thin film fabricated by the epitaxial film forming method according to claim 1.

4. An illuminating device comprising the semiconductor light emitting element according to claim 3.

5. An epitaxial film forming method of forming an epitaxial film of a Group III nitride semiconductor thin film by sputtering on an $\alpha$-$Al_2O_3$ substrate by using a vacuum processing apparatus including:
   a vacuum chamber capable of vacuum pumping;
   a substrate holder for supporting the $\alpha$-$Al_2O_3$ substrate; and
   a heater capable of heating the $\alpha$-$Al_2O_3$ substrate held by the substrate holder to a desired temperature,
   wherein an epitaxial film of a Group III nitride semiconductor thin film is formed by sputtering on the $\alpha$-$Al_2O_3$ substrate in a state where the $\alpha$-$Al_2O_3$ substrate held by the substrate holder is held away from a substrate facing surface of the heater by 0.5-5 mm, and
   wherein the epitaxial film has a +c polarity.

6. The epitaxial film forming method according to claim 5, wherein the substrate holder holds the $\alpha$-$Al_2O_3$ substrate in a state where the substrate holder is in contact with a surface of the $\alpha$-$Al_2O_3$ substrate on a lower side in a direction of gravity.

7. A semiconductor light emitting element manufacturing method comprising the epitaxial film forming method according to claim 5.

8. A semiconductor light emitting element comprising an epitaxial film of a Group III nitride semiconductor thin film fabricated by the epitaxial film forming method according to claim 5.

9. An illuminating device comprising the semiconductor light emitting element according to claim 8.

* * * * *